(12) United States Patent
Gupta et al.

(10) Patent No.: US 8,735,234 B2
(45) Date of Patent: May 27, 2014

(54) SELF-ALIGNED ION IMPLANTATION FOR IBC SOLAR CELLS

(75) Inventors: Atul Gupta, Beverly, MA (US); Nicholas Bateman, Reading, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 131 days.

(21) Appl. No.: 13/028,562

(22) Filed: Feb. 16, 2011

(65) Prior Publication Data

US 2011/0201188 A1    Aug. 18, 2011

Related U.S. Application Data

(60) Provisional application No. 61/305,764, filed on Feb. 18, 2010.

(51) Int. Cl.
*H01L 21/338* (2006.01)
*H01L 21/8238* (2006.01)
*H01L 21/8242* (2006.01)

(52) U.S. Cl.
USPC ........... 438/181; 438/185; 438/231; 438/232; 438/251; 257/E21.057; 257/E21.12; 257/E21.147; 257/E21.343; 257/E21.346

(58) Field of Classification Search
USPC .................................. 257/E21.346, E21.347
See application file for complete search history.

(56) References Cited

U.S. PATENT DOCUMENTS

| | | | |
|---|---|---|---|
| 3,986,896 A | 10/1976 | Ueno et al. | |
| 6,337,283 B1 | 1/2002 | Verlinden et al. | |
| 6,423,568 B1 | 7/2002 | Verlinden et al. | |
| 7,339,110 B1 | 3/2008 | Mulligan et al. | |
| 7,888,249 B2 * | 2/2011 | Bateman et al. | 438/527 |
| 2009/0227095 A1 * | 9/2009 | Bateman et al. | 438/514 |
| 2009/0227097 A1 | 9/2009 | Bateman et al. | |
| 2009/0308439 A1 | 12/2009 | Adibi et al. | |
| 2010/0044721 A1 * | 2/2010 | Fujikawa et al. | 257/77 |
| 2010/0154870 A1 * | 6/2010 | Bateman et al. | 136/252 |

FOREIGN PATENT DOCUMENTS

| | | |
|---|---|---|
| EP | 0851511 A1 | 7/1998 |
| EP | 1024523 A1 | 8/2000 |
| JP | 61141125 A | 6/1986 |

OTHER PUBLICATIONS

Christian Schmiga et al., Large-Area N-type Silicon Solar Cells with Printed Contacts and Aluminium-Alloyed Rear Emitter, 2009, pp. 1-4, 24th European PV Solar Energy Conference and Exhibition, Sep. 21-25, 2009, Hamburg, Germany.

Michael Rauer et al., Passivation of Screen Printed Aluminium-Alloyed Emitters for Back Junction N-Type Silicon Solar Cells, 2009, pp. 1-4, 24th European PV Solar Energy Conference and Exhibition, Sep. 21-25, 2009, Hamburg, Germany.

(Continued)

*Primary Examiner* — Mohsen Ahmadi

(57) ABSTRACT

An improved method of doping a substrate is disclosed. The method is particularly beneficial to the creation of interdigitated back contact (IBC) solar cells. A paste having a dopant of a first conductivity is applied to the surface of the substrate. This paste serves as a mask for a subsequent ion implantation step, allowing ions of a dopant having an opposite conductivity to be introduced to the portions of the substrate which are exposed. After the ions are implanted, the mask can be removed and the dopants may be activated. Methods of using an aluminum-based and phosphorus-based paste are disclosed.

13 Claims, 5 Drawing Sheets

(56) References Cited

OTHER PUBLICATIONS

H. Haverkamp et al., Screen Printed Low-Cost IBC Solar Cells—Preparatory Investigations, 2005, pp. 1-3, 20th European PV Solar Energy Conference and Exhibition, Jun. 2005, Barcelona, Spain.

Matthew Edwards, Screen-Print Selective Diffusions for High-Efficiency Industrial Silicon Solar Cells, May 10, 2007, pp. 31-45, Progress in Photovoltaics: Research & Applications, vol. 16, John Wiley & Sons, Ltd.

* cited by examiner

SELF-ALIGNED ION IMPLANTATION FOR IBC SOLAR CELLS

This application claims priority of U.S. Provisional Patent Application Ser. No. 61/305,764, filed Feb. 18, 2010, the disclosure of which is incorporated herein by reference in its entirety.

FIELD

This invention relates to solar cells and, more particularly, to solar cells formed using ion implantation.

BACKGROUND

Ion implantation is a standard technique for introducing conductivity-altering impurities into a workpiece. A desired impurity material is ionized in an ion source, the ions are accelerated to form an ion beam of prescribed energy, and the ion beam is directed at the surface of the workpiece. The energetic ions in the beam penetrate into the bulk of the workpiece material and are embedded into the crystalline lattice of the workpiece material to form a region of desired conductivity.

Solar cells are one example of a device that uses silicon workpieces. Any reduced cost to the manufacture or production of high-performance solar cells or any efficiency improvement to high-performance solar cells would have a positive impact on the implementation of solar cells worldwide. This will enable the wider availability of this clean energy technology.

Solar cells typically consist of a p-n semiconducting junction. FIG. 1 is a cross-sectional view of an interdigitated back contact (IBC) solar cell. In the IBC solar cell, the p-n junction is on the back or non-illuminated surface of the solar cell. Photons 10 enter the solar cell 100 through the top (or illuminated) surface, as signified by the arrows. These photons pass through an anti-reflective coating 104, designed to maximize the number of photons that penetrate the substrate 100 and minimize those that are reflected away from the substrate. The ARC may be comprised of an $SiN_x$ layer. Beneath the ARC 104 may be a $SiO_2$ layer 103, also known as a passivation layer. Of course, other dielectrics may be used. On the back side of the solar cell 100 is an emitter region 204.

Internally, the solar cell 100 is formed so as to have a p-n junction. This junction is shown as being substantially parallel to the top surface of the solar cell 100, although there are other implementations where the junction may not be parallel to the surface. In some embodiments, the solar cell 100 is fabricated using an n-type substrate 101. The photons 10 enter the solar cell 100 through the n+ doped region, also known as the front surface field (FSF) 102. The photons with sufficient energy (above the bandgap of the semiconductor) are able to promote an electron within the semiconductor material's valence band to the conduction band. Associated with this free electron is a corresponding positively charged hole in the valence band. In order to generate a photocurrent that can drive an external load, these electron hole (e-h) pairs need to be separated. This is done through the built-in electric field at the p-n junction. Thus, any e-h pairs that are generated in the depletion region of the p-n junction get separated, as are any other minority carriers that diffuse to the depletion region of the device. Since a majority of the incident photons are absorbed in near surface regions of the device, the minority carriers generated in the emitter need to diffuse to the depletion region and get swept across to the other side.

As a result of the charge separation caused by the presence of this p-n junction, the extra carriers (electrons and holes) generated by the photons can then be used to drive an external load to complete the circuit.

The doping pattern is alternating p-type and n-type dopant regions in this particular embodiment. The n+ back surface field 204 may be between approximately 0.1-0.7 mm in width and doped with phosphorus or other n-type dopants. The p+ emitter 203 may be between approximately 0.5-3 mm in width and doped with boron or other p-type dopants. This doping may enable the p-n junction in the IBC solar cell to function or have increased efficiency. FIG. 6 shows a commonly used pattern for the back side of the IBC solar cell. The metallic contacts or fingers 220 are all located on the bottom surface of the solar cell 100. Certain portions of the bottom surface may be implanted with p-type dopants to create emitters 203. Other portions are implanted with n-type dopants to create more negatively biased back surface field 204. The back surface is coated with a passivating layer 210 to enhance the reflectivity of the back surface. Metal fingers 220b are attached to the emitter 203 and fingers 220a attaches to the BSF 204.

Thus, to form the IBC solar cell, two patterned doping steps may be required. These patterned doping steps need to be aligned to prevent the p+ emitter 203 and the n+ back surface field 204 from overlapping. Poor alignment or overlapping may be prevented by leaving a gap between the p+ emitter 203 and the n+ back surface field 204, but this may degrade performance of the IBC solar cell. Even when properly aligned, such patterned doping may have large manufacturing costs. For example, photolithography or hard masks (such as an oxide) may be used, but both are expensive and require extra process steps.

FIG. 2 is a block diagram of a first method to form an IBC solar cell according to the prior art. This process requires two patterned diffusion steps (shown as "Screen Print Patterned Resist") which must be well aligned to produce the pattern of FIG. 6. FIG. 3 is a block diagram of a second method to form an IBC solar cell. This embodiment performs a first blanket diffusion. The emitter is then etched to expose underlying silicon. The etch mask and the diffusion mask can be the same, although different chemistries are used to etch the oxide mask and to dope the underlying silicon.

The embodiments of FIGS. 2-3 both require a large number of expensive process steps to form an IBC solar cell. While the embodiment of FIG. 3 uses fewer process steps than the embodiment of FIG. 2, it is still complicated and still uses multiple wet steps. For these embodiments of FIGS. 2-3, the addition of an oxide layer is yet another extra process step.

Therefore, there is a need in the art for an improved method of doping for solar cells and, more particularly, an improved method of doping for IBC solar cells using ion implantation.

SUMMARY

An improved method of doping a substrate is disclosed. The method is particularly beneficial to the creation of interdigitated back contact (IBC) solar cells. A paste having a dopant of a first conductivity is applied to the surface of the substrate. This paste serves as a mask for a subsequent ion implantation step, allowing ions of a dopant having an opposite conductivity to be introduced to the portions of the substrate which are exposed. After the ions are implanted, the mask can be removed and the dopants may be activated.

Methods of using an aluminum-containing and phosphorus-containing paste are disclosed.

BRIEF DESCRIPTION OF THE DRAWINGS

For a better understanding of the present disclosure, reference is made to the accompanying drawings, which are incorporated herein by reference and in which.

DETAILED DESCRIPTION

Figure 1:
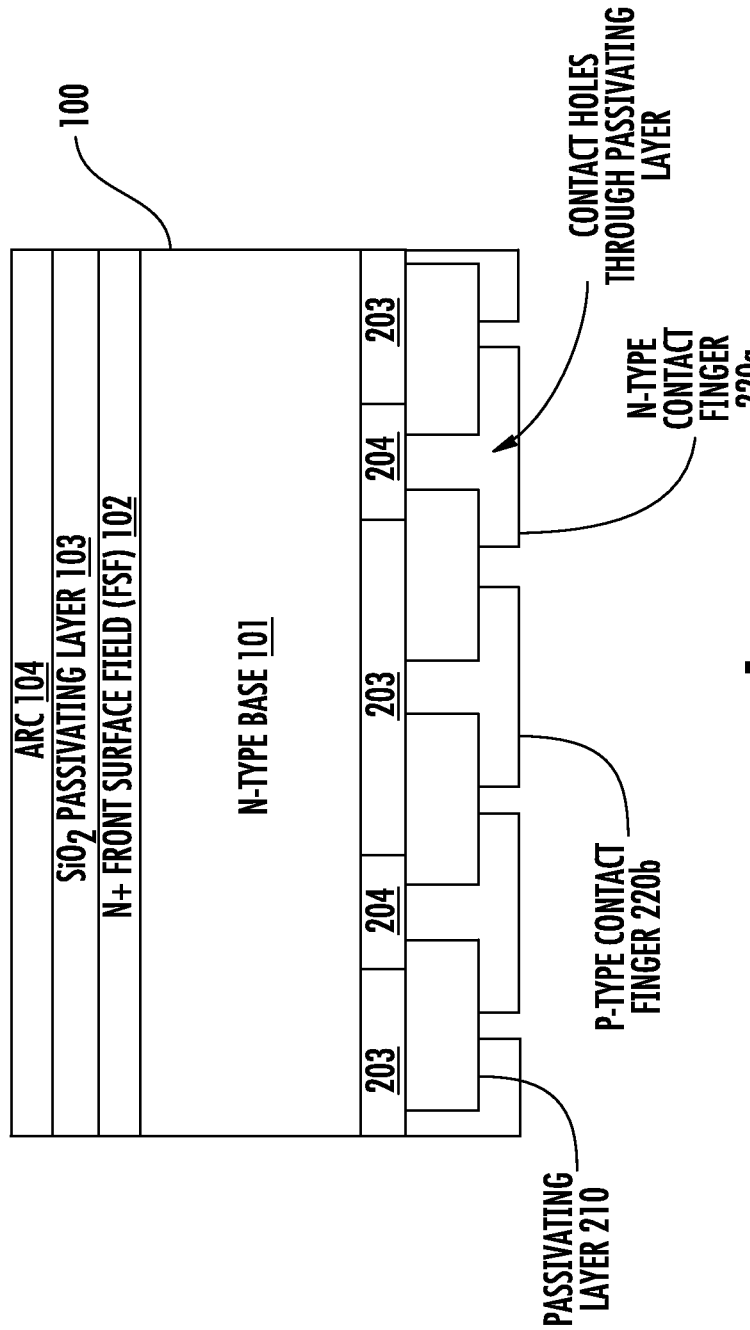
FIG. 1 is a cross-sectional view of an IBC solar cell.
Figure 2:
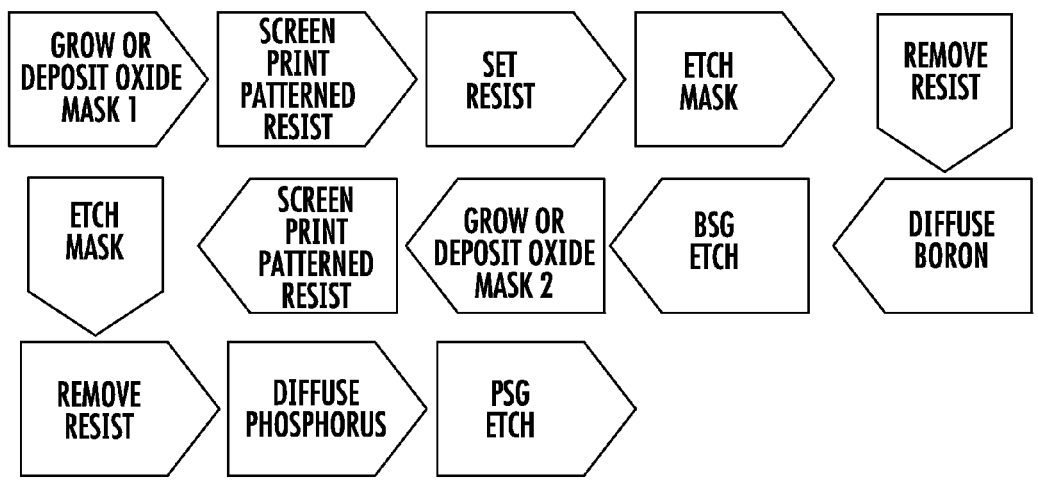
FIG. 2 is a block diagram of a first method to form an IBC solar cell according to the prior art.
Figure 3:
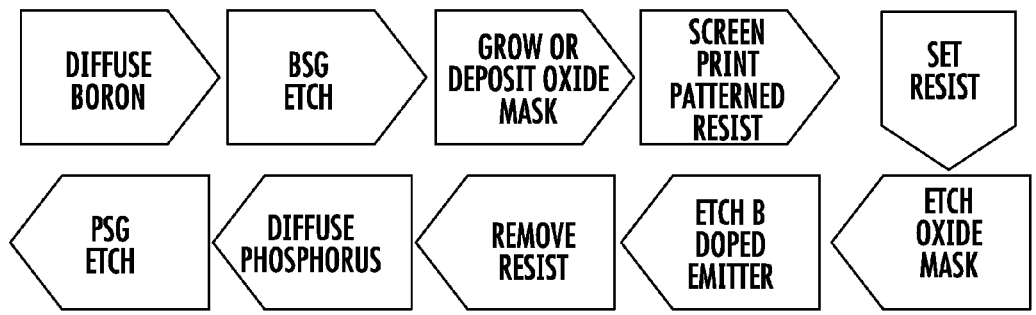
FIG. 3 is a block diagram of a second method to form an IBC solar cell according to the prior art.

The embodiments of the solar cell are described herein in connection with an ion implanter. Beamline ion implanters, plasma doping ion implanters, focused plasma systems, systems that modulate a plasma sheath, or flood ion implanters may be used. However, the gaseous diffusion, furnace diffusion, laser doping, other plasma processing tools, or other methods known to those skilled in the art also may be used. While specific n-type and p-type dopants are listed, other n-type or p-type dopants may be used instead and the embodiments herein are not limited solely to the dopants listed. Furthermore, while one particular embodiment of a solar cell is specifically listed, embodiments of this process may be applied to other solar cell designs or other workpieces such as semiconductor wafers or flat panels. Thus, the invention is not limited to the specific embodiments described below.

FIGS. 4A-D are cross-sectional views of a first method to form an IBC solar cell. In FIG. 4A, an aluminum paste 301 is printed on the solar cell 300 in the pattern of the emitter. Screen printing may be used in one instance, though other printing methods known to those skilled in the art likewise may be used.

In FIG. 4B, the solar cell 300 is fired in a furnace. The temperature is sufficiently high so as to allow the aluminum to melt into the solar cell 300. The furnace may be an in-line furnace that, in one embodiment, operates between approximately 550° C. and 850° C. The aluminum paste 301 melts and forms a eutectic with the silicon of the solar cell 300. The aluminum paste 301 also forms a doped layer 303 approximately 2-10 μm into the silicon of the solar cell 300. This doped layer forms the p+ emitter 303 of the solar cell 300.

The solar cell 300 is then implanted with a species 310 in FIG. 4C. The species 310 may be phosphorus and may form the n+ back surface field 304. In other embodiments, other Group V elements may be used as the n-type dopant. The aluminum paste 301 may serve as a mask that substantially prevents the species 310 from being implanted into the solar cell 300 beneath the aluminum paste 301. In other words, a majority of the species 310 do not penetrate through the aluminum paste 301. In some embodiments, at least 90% of the species 310 do not penetrate through the aluminum page 301. In some embodiments, 100% of the ions may be blocked.

In one particular embodiment, the side of the solar cell 300 opposite the n+ back surface field 304 may be implanted with phosphorus or another n-type dopant at least partially simultaneously or during a subsequent step. This creates a front surface field.

In FIG. 4D, the aluminum paste 301 and the aluminum-silicon eutectic are removed using, for example, a wet step. In some embodiments, this is an acid etch. The doped silicon that was amorphized during the implantation of FIG. 4C may resist this wet step. The eutectic is removed to enable proper passivation of the p+ emitter 303. The implanted dopants are then activated in a thermal activation step, such as an anneal step. An oxide may be grown at least partially during this anneal step in one instance to passivate both the front and back surfaces of the solar cell 300.

FIGS. 5A-D are cross-sectional views of a second method to form an IBC solar cell. A phosphorus doping paste 401 is applied to the solar cell 400 in FIG. 5A. In other embodiments, n-type dopants such as arsenic or antimony may be used. P-type dopants such as boron, aluminum, gallium or indium may also be used.

Then, a species 405 is implanted into the solar cell 400 in FIG. 5B. The species 405 may be boron or another p-type dopant and may form the p+ emitter 403. The phosphorus doping paste 401 may serve as a mask that substantially prevents the species 405 from being implanted into the solar cell 400 beneath the phosphorus doping paste 401. In other words, a majority of the species 405 do not penetrate through the doping paste 401. In some embodiments, at least 90% of the species 405 do not penetrate through the doping page 401. In some embodiments, 100% of the ions may be blocked.

In other embodiments, the species 405 may be any of the species listed above, including aluminum, arsenic, antimony, phosphorus, gallium and indium. In other words, a paste containing a p-type dopant may be applied, followed by an implant of ions from an n-type dopant. In other embodiments, such as described above, a paste containing an n-type dopant is applied, followed by an implant of ions from a p-type dopant.

The phosphorus doping paste 401 may take a longer time to penetrate the substrate than the aluminum paste 301. Thus, the diffusion step may be combined with an anneal or the activation of the implanted p+ emitter 403 illustrated in FIG. 5B to reduce processing time. Thus, at the same time, the implanted boron is activated, and the phosphorus diffuses from the paste into the silicon. In another embodiment, the diffusion of the phosphorus may be done at a different time that the activation of the p-type dopant.

Thus, in FIG. 5C, the solar cell 400 is annealed. This activates the p+ emitter 403 and causes phosphorus to diffuse into the solar cell 400 and form the n+ back surface field 404. Of course, separate thermal steps for phosphorus diffusion and boron activation may be performed. In one instance, an oxide layer is grown on the side of the cell opposite of the n+ back surface field 404 during a thermal or anneal step.

In FIG. 5D, the phosphorus doping paste 401 is removed. The phosphorus doping paste 401 may form a phosphorus-silicate glass during the anneal process. An etch step or a buffered HF process may be used to remove the phosphorus doping paste 401 in one instance.

Figure 4:
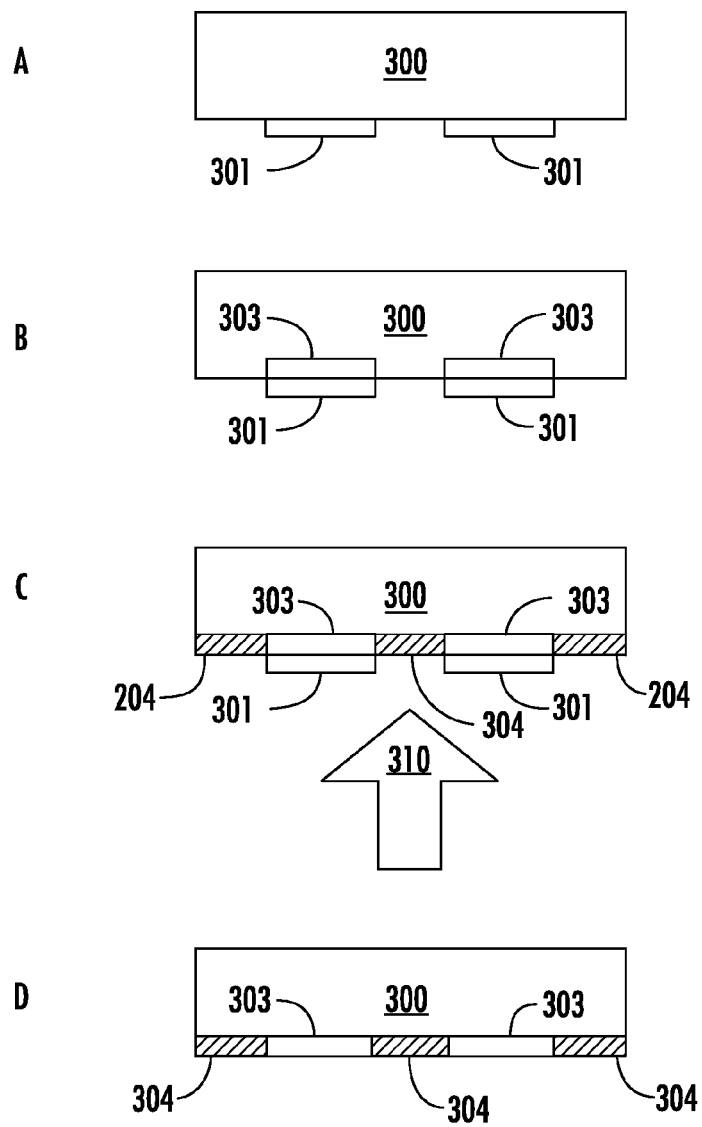
FIGS. 4A-D are cross-sectional views of a first method to form an IBC solar cell.
Figure 5:
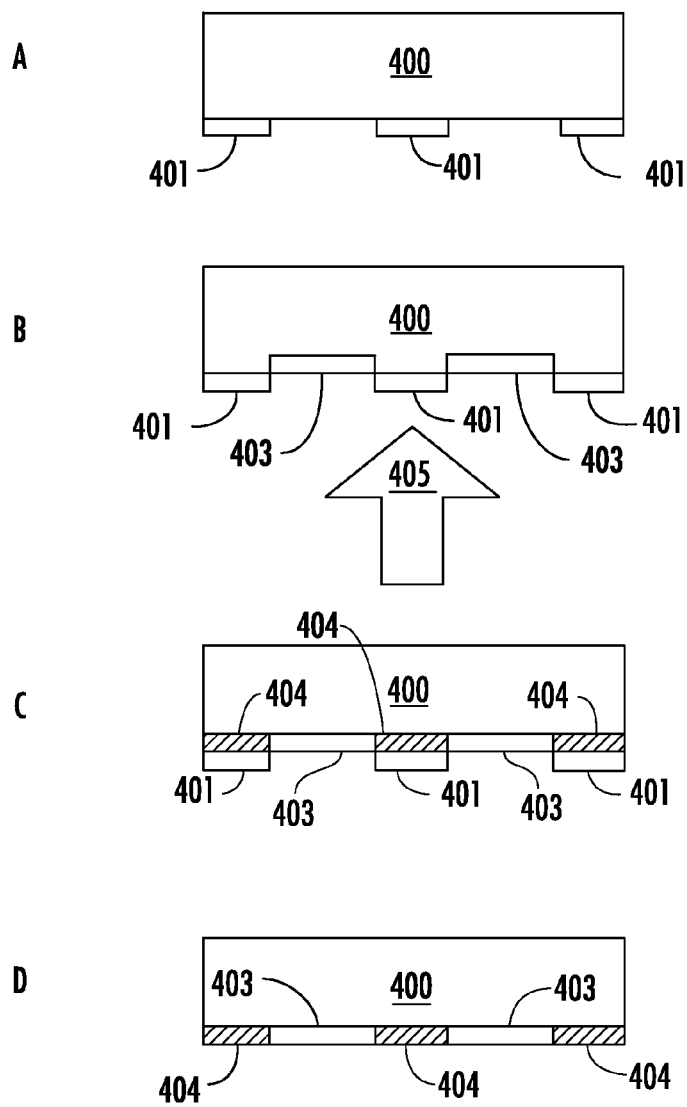
FIGS. 5A-D are cross-sectional views of a second method to form an IBC solar cell.
Figure 6:
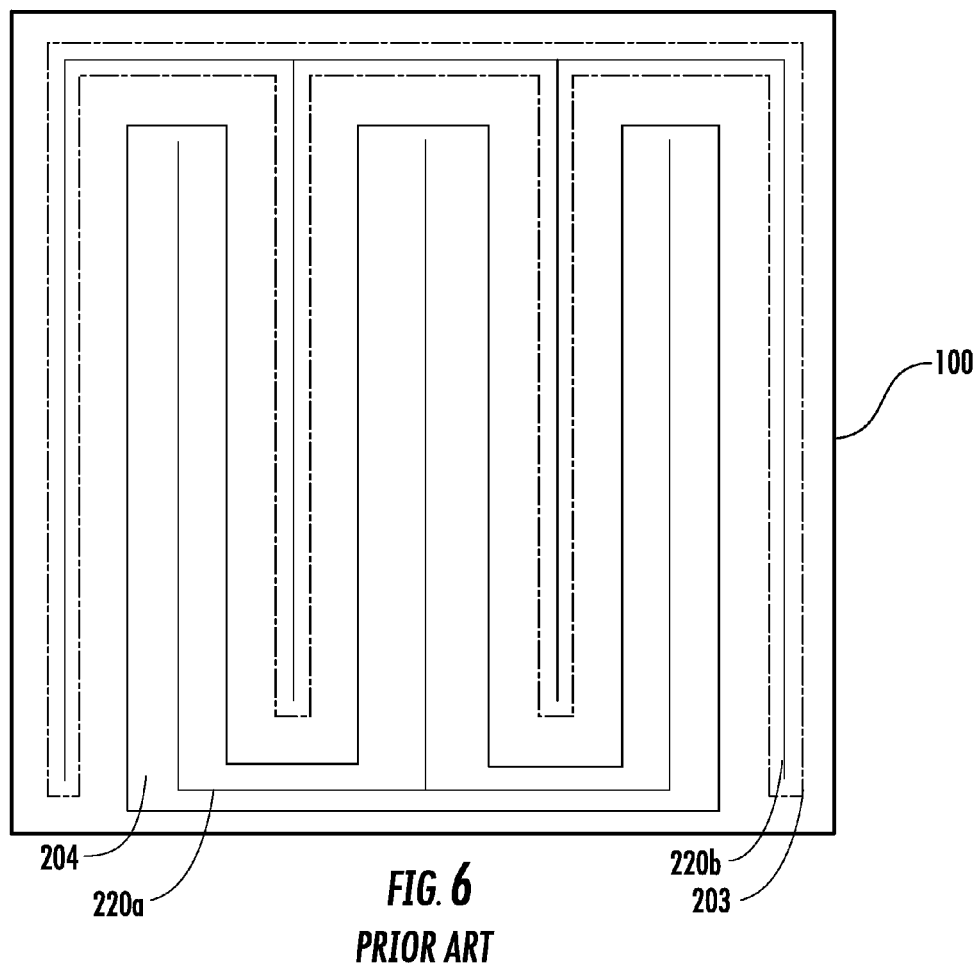
FIG. 6 is a bottom view of the IBC solar cell of FIG. 1.

The embodiments of FIGS. 4-5 allow doped n-type and p-type regions directly next to or adjacent one another. Thus, the n-type and p-type regions are aligned and the p-n junction may be narrow due to the high dopant concentrations on either side of the junction. Carriers may cross the junction through quantum mechanical tunneling. Thermal steps in the embodiments of FIGS. 4-5 may be lengthened to enable dopants to diffuse across the junction. As dopants diffuse across this junction, the net carrier concentration at the boundary may be reduced and the depletion depth may be increased. Deeper depletion regions inhibit tunneling.

In other embodiments, the conductivity of the two dopants used may be the same. For example, it may be beneficial to diffuse a dopant into a portion of a solar cell, while implanting ions of similar conductivity into adjacent portions of the solar cell.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of creating adjacent regions of opposite conductivity on a substrate, comprising:
    applying a paste comprising a dopant of a first species onto a portion of a surface of said substrate, wherein said first species is n-type;
    implanting ions of a dopant of a second species into said surface while said paste is on said portion of said surface, wherein said paste serves as a mask that substantially prevents ions of said dopant of said second species from being implanted into said substrate beneath said paste and wherein said second species is p-type;
    performing a thermal process after said implanting to diffuse said first species from said paste into said portion of said substrate; and
    removing said paste after said thermal process and said implanting of ions of said dopant of said second species, wherein said portion is doped by diffusion of said first species and an adjacent portion is doped by implantation of said second species.

2. The method of claim 1, wherein said second species is selected from the group consisting of aluminum, boron, gallium, and indium.

3. The method of claim 1, further comprising performing a second thermal process to activate said second species.

4. The method of claim 3, wherein a passivation agent is applied to a surface opposite said surface of said substrate during said thermal process or during said second thermal process.

5. The method of claim 1, wherein said thermal process is performed to anneal implant damage from said second species.

6. The method of claim 5, further comprising applying a passivation agent to a surface opposite said surface during said thermal process.

7. The method of claim 1, wherein greater than 90% of said ions of said second species are blocked.

8. The method of claim 1, wherein said first species is selected from the group consisting of phosphorus, arsenic, and antimony.

9. The method of claim 1, wherein 100% of said ions of said dopant of said second species are blocked.

10. A method of creating adjacent regions of opposite conductivity on a substrate, comprising:
    applying a paste comprising phosphorus onto a portion of a surface of said substrate;
    implanting boron ions into said surface while said paste is on said surface, wherein said paste serves as a mask that substantially prevents said boron ions from being implanted into said substrate beneath said paste;
    performing a thermal activation process after implanting said boron ions and while said paste is on said surface so as to diffuse said phosphorus from said paste into said substrate and anneal implant damage from said boron ions; and
    removing said paste after said thermal activation; thereby creating a substrate having said portion doped by diffusion of phosphorus, and an adjacent portion doped by boron implantation.

11. The method of claim 10, further comprising applying a passivation agent to a surface opposite said surface of said substrate during said thermal activation process.

12. The method of claim 10, wherein greater than 90% of said boron ions are blocked.

13. The method of claim 10, wherein 100% of said boron ions are blocked.

* * * * *